(12) United States Patent
Keller et al.

(10) Patent No.: US 8,732,632 B1
(45) Date of Patent: May 20, 2014

(54) METHOD AND APPARATUS FOR AUTOMATED EXTRACTION OF A DESIGN FOR TEST BOUNDARY MODEL FROM EMBEDDED IP CORES FOR HIERARCHICAL AND THREE-DIMENSIONAL INTERCONNECT TEST

(71) Applicant: Cadence Design Systems, Inc., San Jose, CA (US)

(72) Inventors: Brion Keller, Binghamton, NY (US); Pradeep Nagaraj, Fremont, CA (US); Richard Schoonover, Binghamton, NY (US); Vivek Chickermane, Ithaca, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/835,871

(22) Filed: Mar. 15, 2013

(51) Int. Cl.
*G06F 17/50* (2006.01)
(52) U.S. Cl.
USPC ............ 716/102; 716/101; 716/106; 716/107
(58) Field of Classification Search
USPC .................. 716/101, 102, 106, 107
See application file for complete search history.

(56) References Cited

U.S. PATENT DOCUMENTS

| | | | |
|---|---|---|---|
| 7,080,299 B2 | 7/2006 | McLaurin | |
| 7,340,700 B2 | 3/2008 | Emerson et al. | |
| 7,568,141 B2 | 7/2009 | Menon et al. | |
| 7,607,057 B2 | 10/2009 | Boike et al. | |
| 7,653,849 B1 * | 1/2010 | Tabatabaei | 714/726 |
| 8,296,694 B1 | 10/2012 | Chakravadhanula et al. | |
| 2007/0255986 A1 | 11/2007 | Chang et al. | |
| 2008/0034262 A1 | 2/2008 | Whetsel | |
| 2008/0034334 A1 * | 2/2008 | Laouamri et al. | 716/4 |
| 2008/0288842 A1 * | 11/2008 | Waayers et al. | 714/729 |
| 2011/0307750 A1 * | 12/2011 | Narayanan et al. | 714/729 |

* cited by examiner

*Primary Examiner* — Jack Chiang
*Assistant Examiner* — Brian Ngo
(74) *Attorney, Agent, or Firm* — Dickstein Shapiro LLP

(57) ABSTRACT

SOC designs increasingly feature IP cores with standardized wrapper cells having vendor-provided test patterns for the internal logic. To test wrapper, interconnect, and other boundary logic, a boundary model is extracted from the design in a synthesis or ATPG environment. Wrapper cells are identified and boundary logic extracted by structural tracing of wrapper chains and tracing from core inputs/outputs to the wrapper cells. A created boundary model excludes core internal logic tested by vendor-provided test patterns to be migrated to the containing chip interface. An SOC ATPG model is built including boundary models for all embedded cores, interconnects, and any other logic residing at the SOC top hierarchical level. This model is very compact yet accurate for testing logic external to all embedded cores. Test time is reduced and test pattern generation greatly simplified, while featuring good test coverage. The same approach is used for 3D packages having multiple dies.

14 Claims, 8 Drawing Sheets

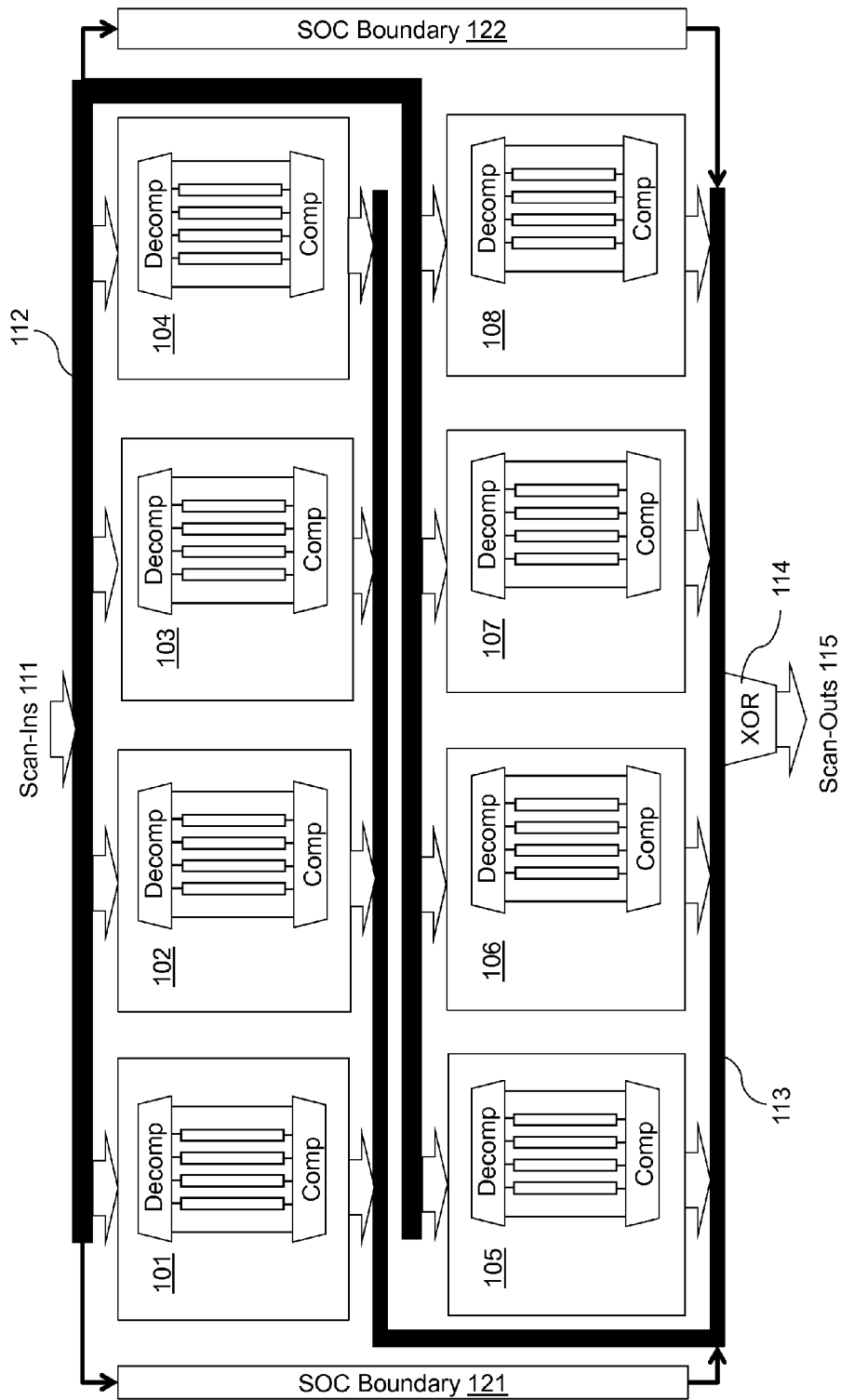

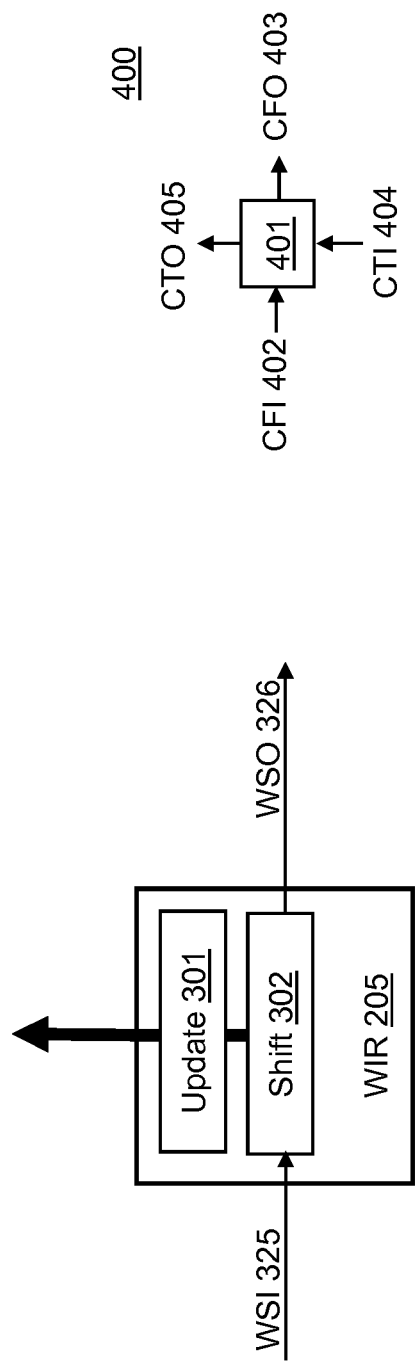

METHOD AND APPARATUS FOR AUTOMATED EXTRACTION OF A DESIGN FOR TEST BOUNDARY MODEL FROM EMBEDDED IP CORES FOR HIERARCHICAL AND THREE-DIMENSIONAL INTERCONNECT TEST

FIELD

The present patent document relates generally to electronic design automation. In particular, the present patent document relates to boundary model extraction for IP cores of system on a chip-type designs.

BACKGROUND

Integrated circuit designs continue to increase in size and complexity, a bottom-up hierarchical design flow is becoming more common. In particular, system on a chip-type designs ("SOC") incorporating a number of intellectual property cores ("IP cores") are increasingly common. SOCs are devices partially or wholly integrating various computer components into a monolithic semiconductor integrated circuit or a single package carrying several interconnected monolithic integrated circuits. "Chip" includes either configuration. An IP core is a reusable unit of logic, cell, or chip layout design that can be used as building blocks along with other logic to create a chip, including SOCs. Examples of IP cores include microprocessors such as those having ARM architectures, and peripheral controllers such as those for PCI Express, SDRAM, Ethernet, or USB devices. IP cores can be available as synthesizable register-transfer level ("RTL") in a suitable hardware description language or as physical layouts at a transistor level. IP cores are so named because an IP core is generally licensed from the vendor who is the party or entity that creates the IP core, and is licensed by the circuit designer for use in the SOC.

In a bottom-up flow the IP cores are separately designed and acquired, then integrated into an SOC. The IP core vendor can also create test patterns specific to a particular IP core, which can then be migrated for use in testing the SOC. The advantage of such an arrangement is that the test patterns are then portable along with the IP core, and may be used for any number of SOC designs incorporating that particular IP core. This simplifies test pattern generation for the SOC as a whole.

The various test patterns created or provided by the various vendors for the IP cores of the SOC do not test the interconnect logic between the IP cores. From the point of view of SOC testability, such logic should be tested. Current techniques to test the interconnect logic first confirm that the entire model of the SOC including the IP cores are built to ensure completeness. Then, each of the fault sites are accounted for within the IP cores that are already tested by the IP core-level test patterns.

The disadvantages of the above-described approach are myriad. First, as designs continue to become larger, the model size and runtime to create automated test pattern generation ("ATPG") models also increase significantly. Depending on the size of the IP core relative to the SOC top-level logic, the runtime increase can be as high as ten- to twenty-fold by including the full IP core along with the interconnect logic during ATPG; the size of the IP core logic can be ten or more times the size of the interconnect logic. For example, an SOC having one hundred million logic gates may have ten million logic gates for boundary, interconnect, and glue logic. Creating an ATPG model for the SOC that includes IP core internal logic gates in addition to the interconnect and glue logic results in a large and complex model, and thus model size and runtime for ATPG are larger than is really necessary. Second, the accuracy of the true interconnect fault coverage is reduced because there is a significant amount of bookkeeping involved for the faults within each IP core; it is not trivial to know which faults should be considered part of the interconnect and which should be part of the IP core internal logic. Third, simulation of the SOC test patterns require huge databases and runtimes. Fourth, delay-annotated simulation is not possible currently without a complete SOC model first being built. Fifth, some IP cores provided by third-parties may not have a full ATPG model due to the third-parties' concerns about protecting their intellectual property, limiting test pattern generation. Sixth, in the above approach, there is no automated generation of testmode setup and ATPG protocol files. Finally, as more and more circuit designs move towards three-dimensional designs having stacks of integrated circuits, developing complete ATPG models for all the embedded dies will become infeasible due to the further increased model size.

One approach that attempts to address these disadvantages is the Interface Logic Model ("mM"). ILM is a concept used in the areas of timing and physical design where gate-level representations of a physical block are used in hierarchical design flows; only the connections from the input to the first level of flip-flops, and the connections from the last stage of flip-flops to the outputs are represented. All other internal flip-flop to flip-flop paths are stripped out in an ILM, such that the ILM is like a black box. For very large chips, using an ILM for all embedded blocks can be a more efficient alternative to a full netlist representation. For static timing analysis ("STA"), if it is infeasible to run STA on the full design, then STA can be run at the block-level for the intra-block paths. Chip-level STA can use ILMs for the inter-block paths. The advantage of ILM for STA is that the entire clock-to-clock path is visible at the top level for interface nets, unlike a traditional block-based hierarchical implementation flow. This gives better accuracy in analysis for interface nets at a negligible increase in overhead due to additional memory and runtime. However, an ILM is insufficient and over-simplified when used for hierarchical design for test ("DFT"), since it is neither complete nor accurate for ATPG. For example, leading companies have attempted to extend ILM for SOC testing, but have found this technique to encounter large numbers of serious problems at the level of the test floor due to extensive miscompares caused by the use of the incomplete and inaccurate ATPG models. Thus, a way to create a more complete and accurate model that still reduces the amount of logic being modeled for an IP core is needed.

SUMMARY

A method and apparatus for boundary model extraction for IP cores of a system on a chip-type design is disclosed.

According to an embodiment a method of generating a reduced gate level model for a circuit design comprises providing, in a test synthesis or ATPG environment, a circuit design having a plurality of logic cores, a plurality of wrapper cells, and controller logic, wherein the plurality of wrapper cells comprise a plurality of boundary logic, including state elements, and are serially-controllable and arranged in a plurality of wrapper chains having a plurality of scan input and output ports, wherein each wrapper cell of the plurality of wrapper cells has one or more input ports and one or more output ports, wherein each logic core is wrapped with one or more wrapper chains of the plurality of wrapper chains, and wherein the controller logic is designed to transmit a plurality of test control signals to the plurality of wrapper cells and their wrapper chains; identifying, for each of one or more test modes defined for the logic core, the plurality of wrapper cells for each input and output port of the plurality of input and output ports for each wrapper chain; performing, for each of the one or more test modes, a plurality of structural traces on the plurality of wrapper chains, including logic core input ports and logic core output ports, to identify boundary logic and controller logic associated with each logic core; extracting, for each of the one or more test modes, the boundary logic and the controller logic; and building a model for the plurality of logic cores based on the extracted boundary logic and the extracted controller logic.

In another embodiment the method further comprises performing a structural trace of one or more of a clock, a scan enable, and scan data paths of the plurality of wrapper chains.

In another embodiment the circuit design is a system on a chip integrated circuit design having wrapped logic cores.

In another embodiment the circuit design is a three-dimensional circuit design comprising a plurality of chips, each chip having a plurality of wrapped logic cores.

In another embodiment the boundary logic includes functional flip-flops of the plurality of logic cores at a boundary of the plurality of logic cores.

In another embodiment the wrapper cells comply with the IEEE 1500 architecture standard.

In another embodiment one or more of the structural traces of the plurality of structural traces are performed in one or more EXTEST modes of the IEEE 1500 architecture standard.

According to an embodiment, the method of generating a boundary model for a wrapped logic core of a circuit design, comprises providing a logic core wrapped with a plurality of wrapper cells in a test synthesis or ATPG environment, wherein the plurality of wrapper cells comprise a plurality of boundary logic, wherein each wrapper cell has one or more input ports and one or more output ports, wherein each wrapper cell is connected to at least one other wrapper cell of a wrapper chain wrapper chain, and wherein the logic core supports a plurality of EXTEST configuration modes; performing, for the plurality of EXTEST configuration modes, a structural trace of the scan chains active in the EXTEST mode, including a scan path, a clock logic, and a control logic; performing, for the plurality of EXTEST configuration modes, a structural trace from the one or more output ports back to the plurality of wrapper cells that control those output ports, and a structural trace from the one or more input ports forward to the plurality of wrapper cells that receive a value from the one or more input ports, to identify a portion of the plurality of boundary logic to be included within a boundary model for the core; identifying, for the plurality of EXTEST configuration modes, one or more control signals found while performing a structural trace, wherein the control signals make a plurality of control logic and registers operate and initialize properly; extracting the portion of the plurality of boundary logic identified by performing the structural traces; and building a boundary model for the logic core based on the extracted portion of the plurality of boundary logic.

According to an embodiment a computer-readable non-transitory storage medium having stored thereon a plurality of instructions is disclosed. The plurality of instructions when executed by a computer, cause said computer to perform providing, in a test synthesis or ATPG environment, a circuit design having a plurality of logic cores, a plurality of wrapper cells, and controller logic, wherein the plurality of wrapper cells comprise a plurality of boundary logic, including state elements, and are serially-controllable and arranged in a plurality of wrapper chains having a plurality of scan input and output ports, wherein each wrapper cell of the plurality of wrapper cells has one or more input ports and one or more output ports, wherein each logic core is wrapped with one or more wrapper chains of the plurality of wrapper chains, and wherein the controller logic is designed to transmit a plurality of test control signals to the plurality of wrapper cells and their wrapper chains; identifying, for each of one or more test modes defined for the logic core, the plurality of wrapper cells for each input and output port of the plurality of input and output ports for each wrapper chain; performing, for each of the one or more test modes, a plurality of structural traces on the plurality of wrapper chains, including logic core input ports and logic core output ports, to identify boundary logic and controller logic associated with each logic core; extracting, for each of the one or more test modes, the boundary logic and the controller logic; and building a model for the plurality of logic cores based on the extracted boundary logic and the extracted controller logic.

In another embodiment the plurality of instructions when executed by a computer, cause said computer to further perform a structural trace of one or more of a clock, a scan enable, and a scan data paths of the plurality of wrapper chains.

In another embodiment the circuit design is a three-dimensional circuit design comprising a plurality of chips, each chip having a plurality of wrapped logic cores.

According to an embodiment a computer-readable non-transitory storage medium having stored thereon a plurality of instructions is disclosed. The plurality of instructions when executed by a computer, cause said computer to perform providing a logic core wrapped with a plurality of wrapper cells in a test synthesis or ATPG environment, wherein the plurality of wrapper cells comprise a plurality of boundary logic, wherein each wrapper cell has one or more input ports and one or more output ports, wherein each wrapper cell is connected to at least one other wrapper cell of a wrapper chain wrapper chain, and wherein the logic core supports a plurality of EXTEST configuration modes; performing, for the plurality of EXTEST configuration modes, a structural trace of the scan chains active in the EXTEST mode, including a scan path, a clock logic, and a control logic; performing, for the plurality of EXTEST configuration modes, a structural trace from the one or more output ports back to the plurality of wrapper cells that control those output ports, and a structural trace from the one or more input ports forward to the plurality of wrapper cells that receive a value from the one or more input ports, to identify a portion of the plurality of boundary logic to be included within a boundary model for the core; identifying, for the plurality of EXTEST configuration modes, one or more control signals found while performing a structural trace, wherein the control signals make a plurality of control logic and registers operate and initialize properly; extracting the portion of the plurality of boundary logic identified by performing the structural traces; and building a boundary model for the logic core based on the extracted portion of the plurality of boundary logic.

The above and other preferred features described herein, including various novel details of implementation and combination of elements, will now be more particularly described with reference to the accompanying drawings and pointed out in the claims. It will be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

FIG. 1A is an illustration of a full design for test model for a hierarchical SOC design having a number of IP cores containing internal scan chains and test compression structures.

FIG. 3 is an illustration of further detail of a wrapper instruction register of a test wrapper cell.

FIG. 4 is an illustration of further detail of a single wrapper cell of a wrapper boundary register, also known as a boundary chain.

Figure 1B:
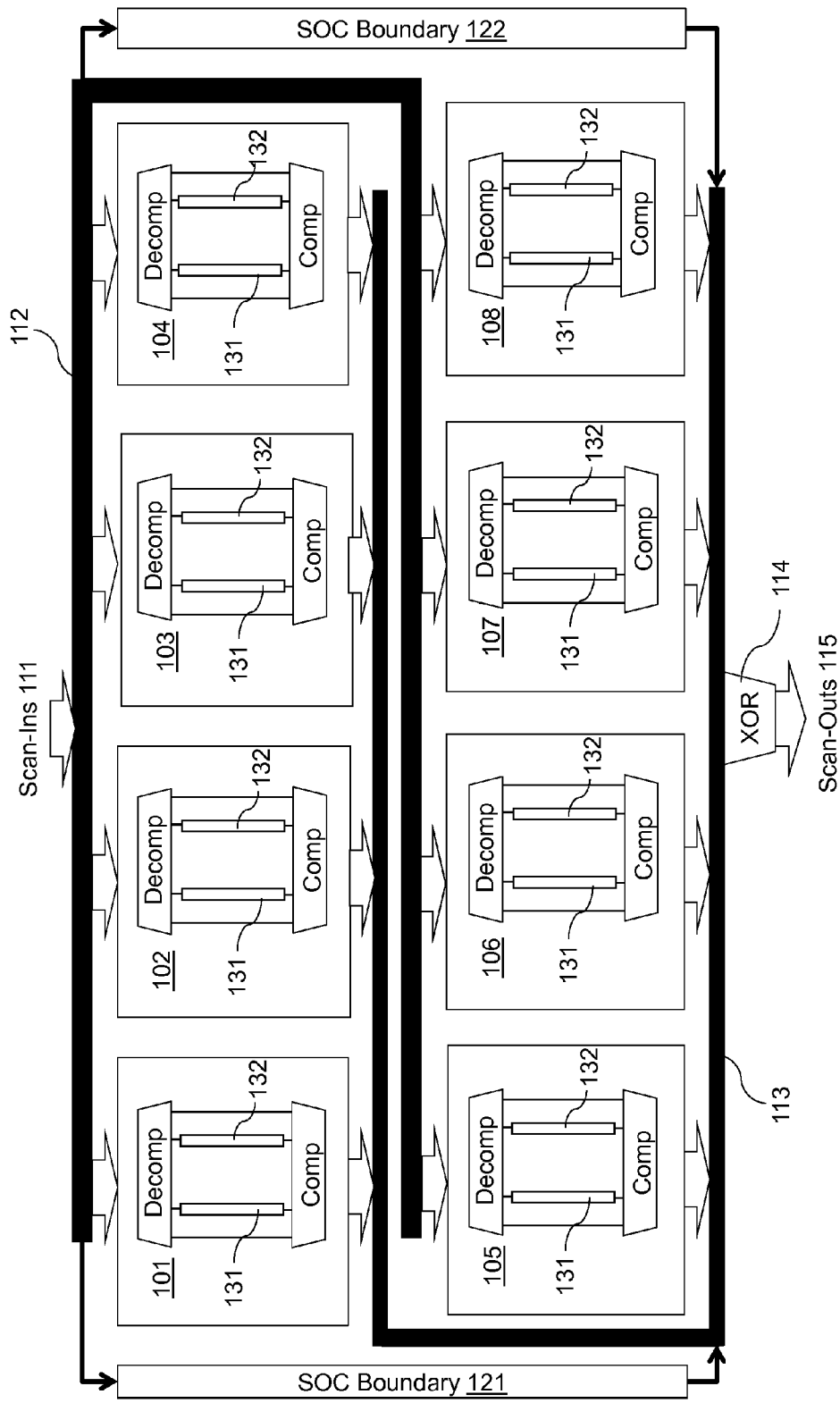
FIG. 1B is an illustration of a full design for test model for a hierarchical SOC design having a number of IP cores, each built using a boundary model.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method and apparatus for automated extraction of a DFT boundary model from embedded IP cores for hierarchical and three-dimensional interconnect test is disclosed. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1A illustrates a full design for test ("DFT") model for a hierarchical design according to an embodiment. The SOC has eight reusable IP cores 101 to 108, but there may be any number of IP cores in the SOC design, as well as other logic outside of the IP cores themselves. Each of the IP cores can be different, or can include a number of instances of the same IP core. For example, IP core 102 may be a copy of IP core 101, and is merely another instance of the same logic. Each of the IP cores contains a number of scan chains, as well as compression ("comp") and decompression ("decomp") logic, to scan test the logic of the IP cores. Scan-Ins 111 originating from off of the SOC chip provide test patterns to each of the IP cores 101 to 108, as well as to the boundary logic of the SOC, SOC Boundary 121 and SOC Boundary 122, using a scan input bus 112. Scan-Ins 111 can be provided by external test equipment, and generated at some prior time by test pattern generation software. The test patterns are applied to the IP cores 101 to 108, scanned through the respective scan chains of the IP cores, and the results compressed and output to a scan output bus 113. Also compressed and output are the test results from test patterns applied to the SOC boundary logic 121 and 122. The outputs are further compressed by compression logic XOR 114 and scan-outs 115 are scanned out of the SOC. Between the IP cores 101 to 108 is additional logic for interconnect that is not tested by the test patterns created for the IP cores.

FIG. 1B illustrates a DFT model for hierarchical design built using boundary models for each core, according to an embodiment. The internal scan chains have been removed from each of cores 101 to 108, and each core has boundary chains 131 and 132 for that core.

Figure 2:
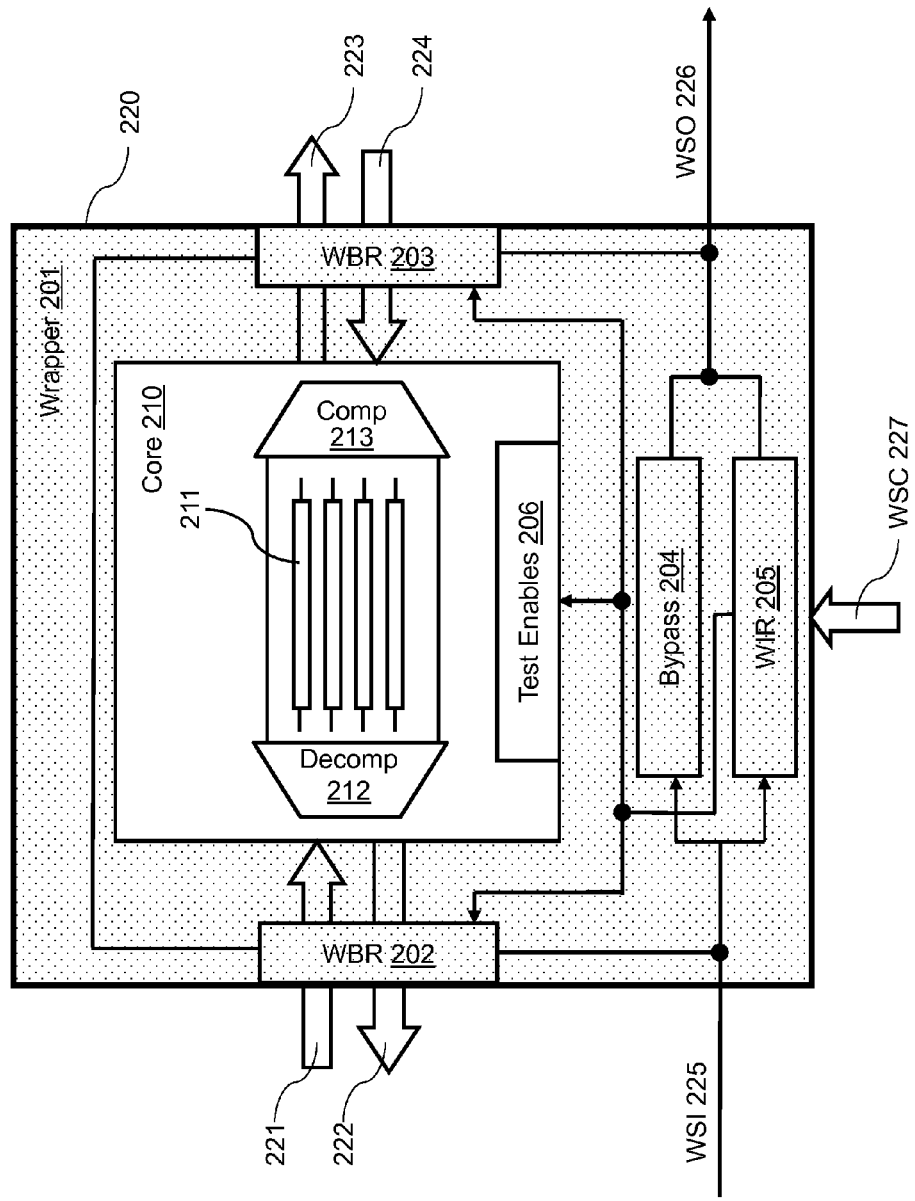
FIG. 2 is an illustration of a single IP core wrapped with a test wrapper cell.

FIG. 2 illustrates an IP core, which may be any of IP cores 101 to 108, having a test wrapper 201, which excludes core 210. Test wrapper 201 comprises the logic and circuits between the edge 220 of the test wrapped IP core and the IP core 210. The core 210 includes a series of scan chains 211, decompression logic 212 and compression logic 213, as well as test enable logic 206. The test wrapper logic 201 includes wrapper boundary registers ("WBR") 202 and 203, bypass logic 204 and wrapper instruction register ("WIR") 205. WBR 202 and WBR 203 provide access to terminals of the core 210 from wrapper interface ports. WBR 202 receives functional inputs 221 from outside the wrapper 201, providing external access to the core 210, transmits functional outputs 222 from core 210 outside the wrapper 201. Likewise, WBR 203 receives functional inputs 224 from outside the wrapper 201, providing external access to the core 210, transmits functional outputs 223 from core 210 outside the wrapper 201. WBR 202 and WBR 203 are each a collection of wrapper cells that are configurable in response to instructions shifted into WIR 205. The wrapper cells contain registers that respond to shift and capture events, further described below in connection with FIG. 4. Control ports for the wrapper include wrapper serial input ("WSI") 225, wrapper serial output ("WSO") 226, and wrapper serial control ("WSC") 227. WSI 225 carries the serial input signal from outside the wrapper 201 to WBR 202, bypass 204 and WIR 205. WSO 226 carries a serial output signal from bypass 204, WIR 205, and WBR 203 to the outside of wrapper 201. WSC 227 is a wrapper serial control bus, carrying seven control signals for the wrapper. These control signals include a wrapper reset ("WRST"), a wrapper clock ("WCLK") signal, a wrapper selection ("SelectWR") signal, a wrapper capture ("Capture") signal, a wrapper shift ("Shift") signal, a wrapper update ("Update") signal, and a wrapper transfer ("Transfer") signal. WIR 205 relies on the state of these control signals to determine the configuration of wrapper 201. FIG. 2 illustrates a wrapper conforming to what is allowed by the IEEE 1500 standard. According to other embodiments, other wrappers may be implemented that do not conform to the IEEE 1500 standard, but that contain similar functional units, including boundary registers and control signals.

Bypass 204 provides functionality for a bypass configuration. In the bypass configuration a data path from the serial input WSI 225 flows through a register of bypass 204 to the serial output WSO 226, bypassing WIR 205, WBR 202, and WBR 203, in addition to core 210. A bypass configuration is mandatory for an IEEE 1500 compliant wrapper, but is not mandatory for the purposes of this disclosure.

FIG. 3 is further detail of WIR 205. WIR 205 configures the wrapper cell into a particular mode of operation, determined from an instruction that is shifted into WIR 205. Such modes include BYPASS, INTEST, and EXTEST MODES. A set of shift registers 302 receive the serial input signal WSI 325, and update circuit 301 decodes the instructions, providing individual controls to WBR 202, WBR 203, and/or test enable 206.

In a BYPASS mode, data flows from the serial input WSI 225 through a register of bypass 204 to the serial output WSO 226, bypassing WIR 205, WBR 202, and WBR 203, as well as bypassing core 210.

In an INTEST MODE, data flows from the serial input WSI 225 to the serial output WSO 226 through WBR 202, the internal scan and functional inputs/outputs of the core 210, and WBR 203.

In an EXTEST MODE, data flows from the serial input WSI 225 to the serial output WSO 226 through WBR 202 and WBR 203. WBR 202 and WBR 203 interact with the external logic being tested external to the wrapped core.

FIG. 4 is a detail view of a single wrapper cell of WBR 202 and WBR 203. WBR 202 can have multiple wrapper cells, as can WBR 203. The wrapper cell has a storage element 401 having four pins, cell functional input ("CFI") 402, cell functional output ("CFO") 403, cell test input ("CTI") 404, and cell test output ("CTO") 405. Storage element 401 can include more than one register, and responds to shift and capture events. The wrapper cell 400, and in particular the storage element 401, can be flexibly structured, depending on the design of the wrapper for the IP core, without affecting the boundary model extraction and creation described in the present disclosure.

Figure 5:
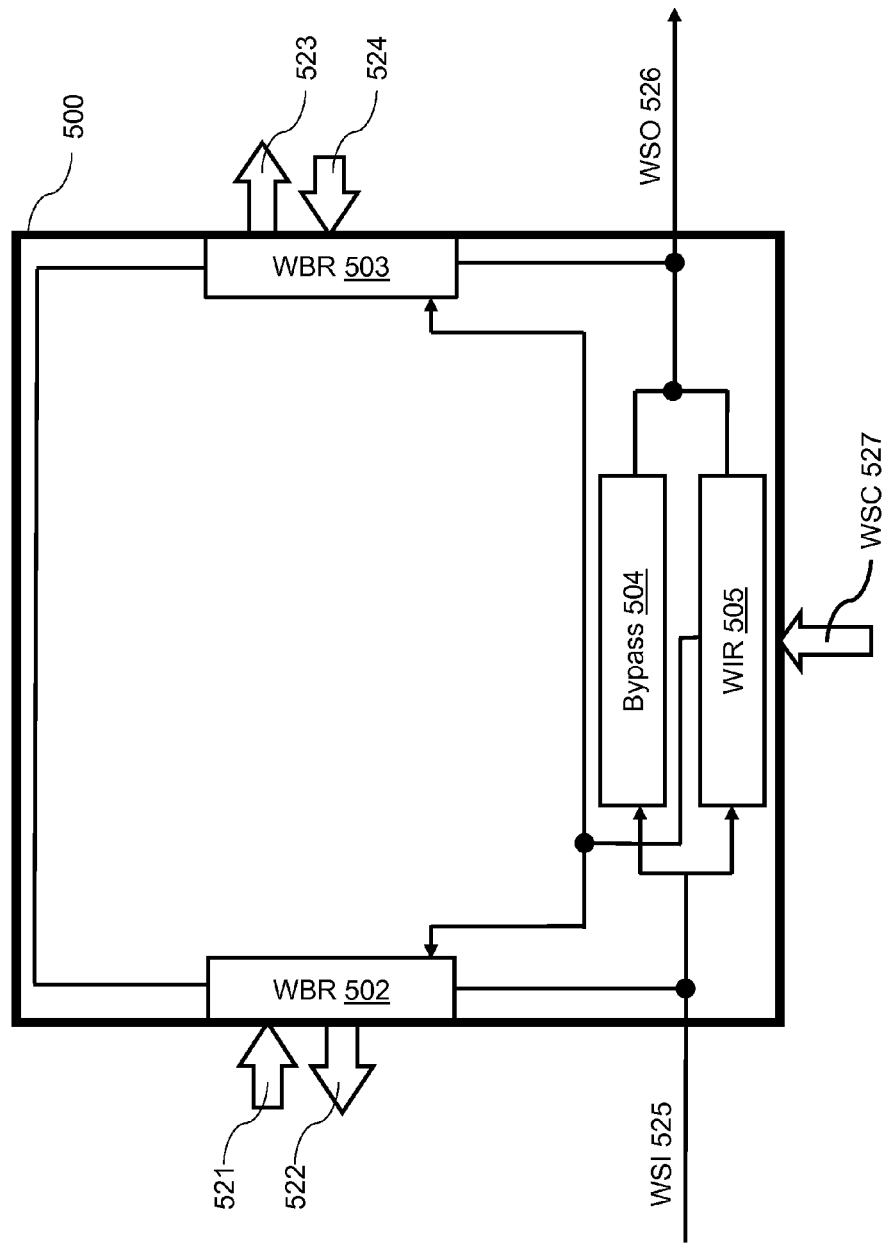
FIG. 5 is an illustration of a DFT boundary model.

FIG. 5 illustrates a DFT boundary model 500, according to an embodiment. The DFT boundary model 500 includes the interconnect and glue logic of a wrapped IP core. Simplistically, it is the remainder of the IP core and test wrapper logic once the logic of the IP core has been removed from the wrapped IP core. This removal leaves behind test logic including WBR 502, WBR 503, bypass circuits 504, WIR 505, and other test and glue logic, including functional flops at the boundary of the IP core that may be used by the wrapper test logic, but not illustrated in FIG. 5. The DFT boundary model 500 takes into account the interconnect and glue logic of the test wrapped IP core, at the level of a structurally and functionally accurate reduced gate level model.

Figure 6:
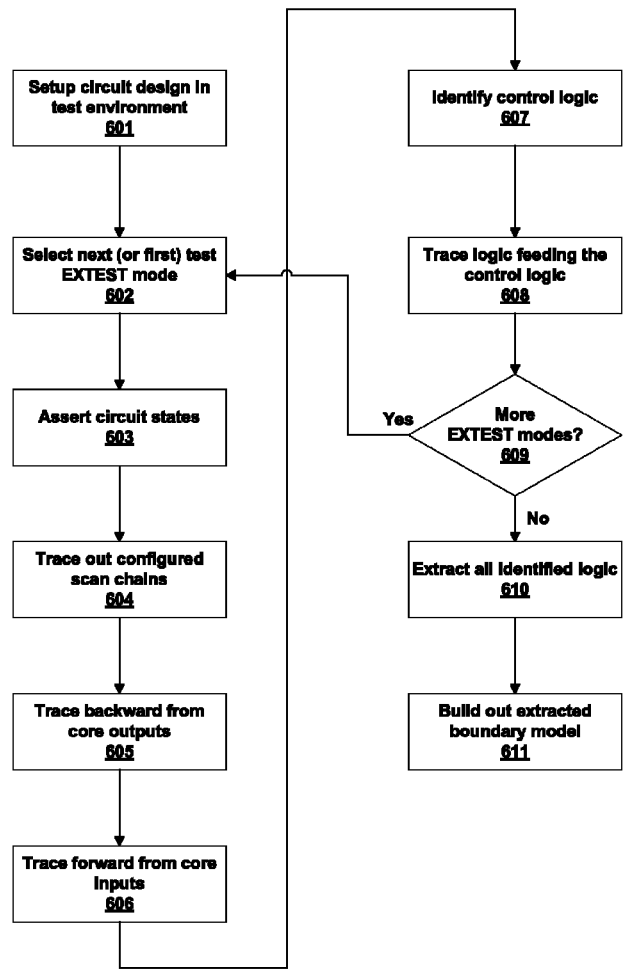
FIG. 6 illustrates a flow for extracting a DFT boundary model from a hierarchical SOC design having a number of IP cores wrapped with a test wrapper cell.

FIG. 6 illustrates a flow for extracting a DFT boundary model according to an embodiment. First, the circuit design is setup in a test synthesis environment or ATPG environment at step 601. The test environment can be any suitable test environment, including a DFT software tool running on a general purpose workstation having a plurality of computing resources including one or more general or special purpose processors, memory, storage, input/output devices, a display, network communication interface devices, and a bus interconnecting the various computing resources. At step 602, the wrapper cells including the WBRs are put into an EXTEST mode by the WIR. This is done in an attempt to analyze the logic necessary to operate all EXTEST modes for the core that will be or may be used when the core is instantiated within a chip. At step 603, all the circuits states that are appropriate for making the selected test mode operation in the wrapped core are asserted. At step 604, the configured scan chains are traced out. This includes the boundary chains, but may include one or more of the bypass registers as well. This should also include all clock and control signals necessary to operate these scan chains. The wrapper cells associated with each input port and output port are identified by analyzing the test wrapper logic chain. The wrapper chains can consist of standardized DFT wrapper cells that isolate the internal logic of the IP cores from the input and output ports in the IP core. The wrapper cells are organized into one or more wrapper chains that can be serially controlled and observed. One standardized wrapper cell is specified by the IEEE 1500 architecture. According to the IEEE 1500 architecture, in an INTEST mode of operation, the wrapper cells can supply the test stimulus to the internal logic of the IP core, and also observe the output response. INTEST can both operate in serial or parallel instruction mode, as specified by an instruction provided to the wrapper instruction register that controls the wrapper cells into one such mode. In an EXTEST mode of operation, the wrapper cells can supply the test stimuli to the external interface of the IP core and capture the response values seen at IP core functional inputs. EXTEST can similarly operate as serial or parallel EXTEST. At step 604, a structural trace of the wrapper chain is performed, tracing from an I/O port of the IP core through a series of wrapper cells to another I/O port of the IP core to identify all the wrapper cells of a wrapper chain and their order within the chain. At step 605, a structural trace is performed, going from all functional output ports of the IP core back to the wrapper cells that controls that output port while ignoring logic paths back to IP core internal state elements that are not part of a wrapper cell. At step 606 a structural trace is performed from all functional input ports of the IP core forward to the wrapper cell that receives and observes values on that input port while ignoring logic paths that lead to IP core internal state elements that are not part of a wrapper cell.

At step 607, the control logic that affects the operation of the wrapper chains and the wrapper cells and which configures the IP core into its various EXTEST modes is identified, including any test control logic and clock control logic. This includes logic within the IP core that is used by the test wrapper. Step 608 is a structural trace to include all logic that feeds the control logic that may be used to load values into the control logic registers. This is identified when tracing back scan chain paths and paths between the boundary registers and the I/Os when encountering a known value (0, 1 or Z and not unknown X) and tracing back the source of that known value to either control register bits or core input pins that are used to configure this EXTEST mode's DFT logic. Control register bits so found will be further traced back to include all logic feeding the control register bit from core inputs, ensuring that the included logic will show how the control register bit obtains its value when an initializing sequence of events is applied to the core input pins. In an IEEE 1500 architecture, the controller logic is the IEEE 1500 controller, including the Wrapper Instruction Register (WIR) and the control signal bus WSC (wrapper serial control). At decision point 609, the program queries whether there are further EXTEST modes to be analyzed. If there are further EXTEST modes, then the program returns to step 602 to repeat steps 602 through 608. If there are not, the program proceeds to step 610. At step 610, when there are no further EXTEST modes to be analyzed, a boundary model is built using the logic identified as needing to be included during the tracing of steps 604 through 608 for all EXTEST modes needing to be considered. This will include elements from the controller logic tracing, boundary logic traces, and clock, scan enable, and scan data path traces. The boundary model extracted during step 610 will contain just the logic seen as necessary in order to be able to operate the set of EXTEST modes that were analyzed, including simulation of required initialization sequences to set up each of those EXTEST modes of operation for the core. All other logic and hierarchy will be dropped from the boundary model because it has no effect on the operation of the given set of EXTEST modes. Note that any logic gate included in the boundary model that is fed from logic not included in the boundary model will see an unknown value (X) on its input from the missing logic. Note that during EXTEST modes, it should not be possible to observe the state of internal logic at the core outputs if the core has been properly wrapped. An improperly wrapped core might show an unpredictable value of X at the core output should a path from the internal logic of the core be sensitized to the core output. INTEST test patterns can then be created for the core that tests the internal logic of the core, and these test patterns can be migrated to be applied during later testing of the chip design. The boundary model, when used to represent the core design within a chip, will provide sufficient logic to describe the operation of the boundary logic and its controls to allow logic within the chip that is outside of the core, or the interconnect between the cores, to be tested. Combined with the migrated tests that cover the core internal logic, the chip can be fully tested using just the migrated tests and the core interconnect tests generated using the boundary models within the chip model. The ATPG done on the chip model using the boundary models for the cores will run much faster and consume much less memory because it doesn't contain all of the core internal logic that is covered by the migrated tests.

Figure 7:
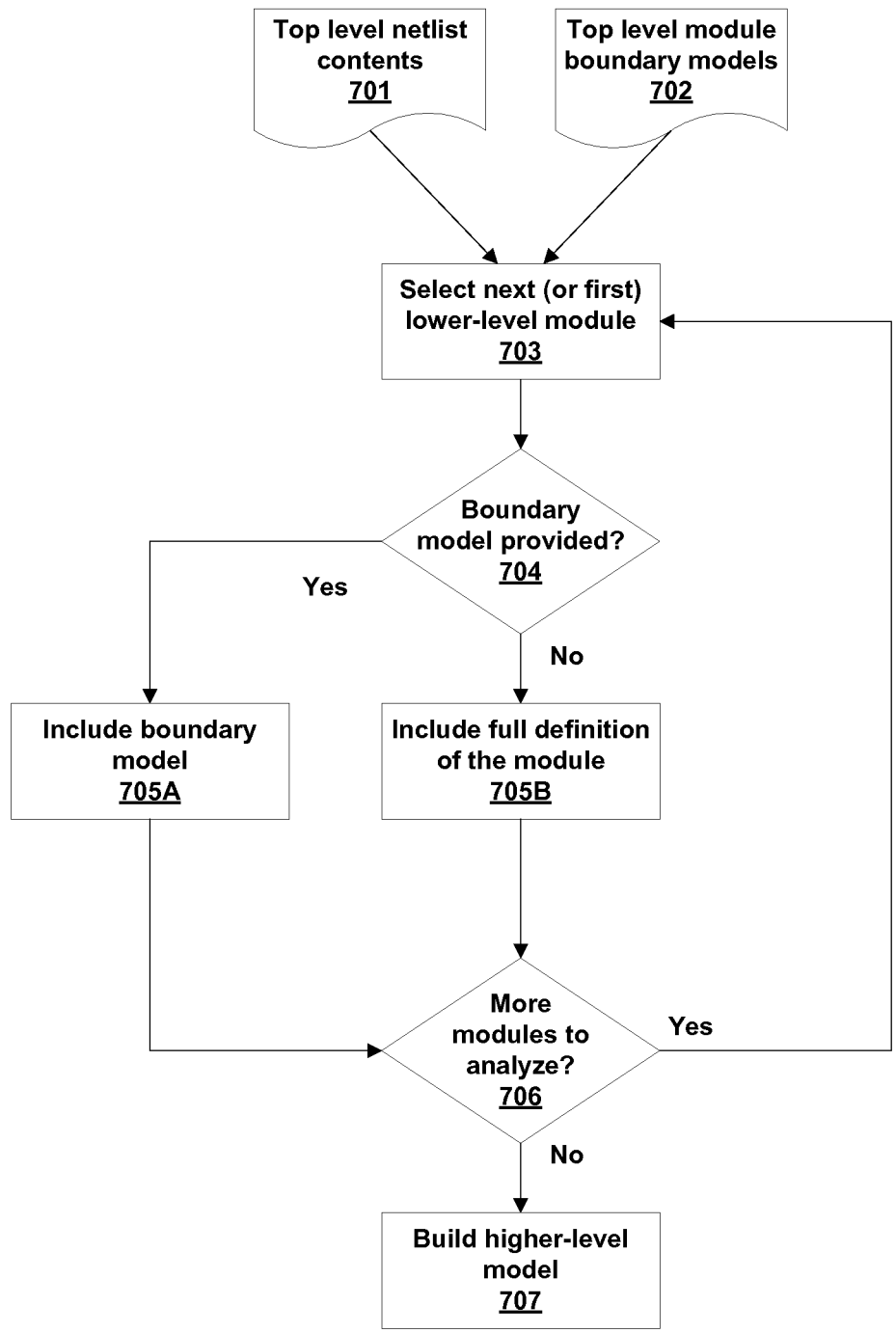
FIG. 7 illustrates a flow for building a higher level model that includes boundary models for the lower level modules.

FIG. 7 illustrates a flow for building a higher level model that includes boundary models for the lower level modules. An input to the flow include the top level netlist definitions 701 for the top level module and all contents of that top level module, be it a chip or a higher level package. Another input to the flow includes a set of boundary models 702 for certain modules that are instantiated within the top level module or within some level of the hierarchy below the top module. At step 703, the first lower-level module is selected and instantiated (or next lower-level module is selected if at least one module has already been analyzed). Step 705 queries whether a boundary model has been provided. If no boundary model has been provided for the lower level module, then at step 705B, the full definition of the module is set to be included in the higher level model. If a boundary model for that module has been provided, then at step 705A, that lower-level module is set to be included in the higher-level model instead of the full definition of that module. After a module has been analyzed, step 706 queries whether there are additional modules to analyze. If so, the flow returns to step 704 to select the next lower-level module for analysis. If no more lower-level modules remain, the flow proceeds to step 707, where the higher-level model is built using the included boundary models and included full definitions of the modules, according to which was set to be included in the model for each lower-level module. The flow of FIG. 7 can be for building a chip model that includes a multiplicity of wrapped cores, or it could be a multichip or 3D stacked module that contains a multiplicity of wrapped chips.

Figure 8:
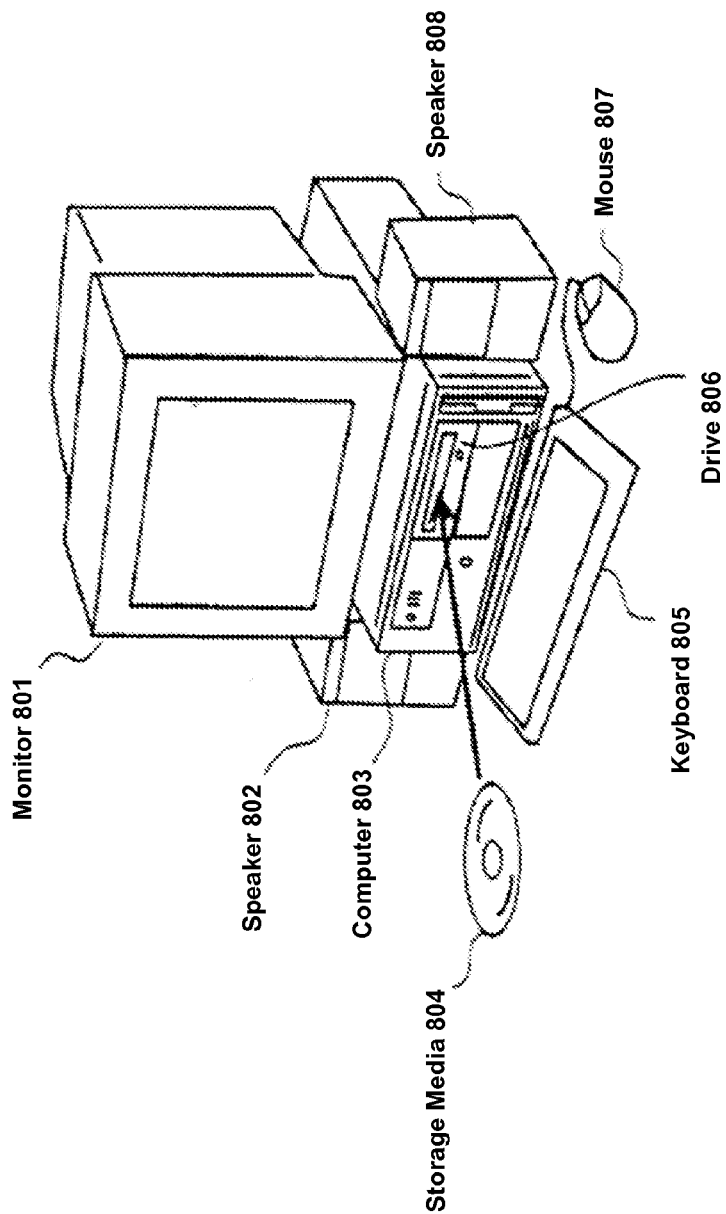
FIG. 8 illustrates an exemplary general-purpose computer system.

FIG. 8 illustrates an exemplary general-purpose computer system, according to an embodiment. The computer system comprises a computer 803 configured to read storage media 804 at its drive 806. The computer system further includes a monitor 801 for the user to view visual output from the computer 803, and keyboard 805 and mouse 807 for the user to input data and commands to computer 803. Storage media 804, although illustrated as an optical disk for an optical drive 806 for ease of understanding in this illustration, may be any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions. The storage media or medium may be internal to the computer 803, or external and attachable through a communication interface. Drive 806 may be any drive suitable for reading storage media 804 or any interface suitable to couple storage media 804 to the bus of computer 803 when storage media 804 is read. The exemplary computer system can be programmed by a user according to the various disclosed embodiments to perform these methods. The computer system may be programmed by reading instructions stored in internal or external computer storage media 804.

The above-disclosed teachings have been validated, including on designs incorporating IEEE 1500 wrapper cells. A boundary model was extracted in each case, and the generated patterns validated in a simulation environment. The extracted boundary model was significantly smaller in gate counts compared to the respective IP cores.

The disclosed teachings provide a number of advantages in hierarchical and three-dimensional interconnect test. The size of the DFT boundary model is significantly reduced, up to ten to fifty-fold compared to a full model of the IP core, without sacrificing the accuracy needed for hierarchical test. Runtimes during ATPG and verification can be reduced by ten to twenty-fold at each step. The disclosed teachings fully support timing annotated simulation, which can provide a ten to twenty-fold performance improvement, and are fully compatible with three-dimensional integrated circuit stacked die test pattern development. They include the scan shift paths that are needed for ATPG. The disclosed approach fully models the TAM or test bus that transports the test stimuli to the block under test, or the test responses, as well as fully model the test and clock control logic that may be obscured from the functional modes in which STA is run. The disclosed teachings provide the ability to differentiate between testmodes, such as EXTEST and INTEST. They fully support structure-accurate fault modeling for the logic under test, and provide fully automated generation of ATPG and simulation setup, including creation of testmode and ATPG protocol files. Because the original netlist is not directly modified according to the disclosed teachings, but instead a new copy of the design is used and reduced, there is no impact in a single pass synthesis flow. Finally, third-party IP developers can still provide just the DFT boundary model for ATPG to their customer, while continuing to retain IP protection by not exposing their entire design to the customer.

Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A method of generating a reduced gate level model for a circuit design, comprising:
   providing, in a memory of a computer system that hosts a test synthesis or ATPG environment, a circuit design having a plurality of logic cores, a plurality of wrapper cells, and controller logic, wherein the plurality of wrapper cells comprise a plurality of boundary logic, including state elements, and are serially-controllable and arranged in a plurality of wrapper chains having a plurality of scan input and output ports, wherein each wrapper cell of the plurality of wrapper cells has one or more input ports and one or more output ports, wherein each logic core is wrapped with one or more wrapper chains of the plurality of wrapper chains, and wherein the controller logic is designed to transmit a plurality of test control signals to the plurality of wrapper cells and their wrapper chains;
   identifying, for each of one or more test modes defined for the logic core, the plurality of wrapper cells for each input and output port of the plurality of input and output ports for each wrapper chain;
   performing, for each of the one or more test modes, a plurality of structural traces on the plurality of wrapper chains, including logic core input ports and logic core output ports, to identify boundary logic and controller logic associated with each logic core;
   extracting, for each of the one or more test modes, the boundary logic and the controller logic; and
   building a model for the plurality of logic cores, stored in the memory of the computer system, based on the extracted boundary logic and the extracted controller logic.

2. The method of claim 1, further comprising performing a structural trace of one or more of a clock, a scan enable, and a scan data paths of the plurality of wrapper chains.

3. The method of claim 1, wherein the circuit design is a system on a chip integrated circuit design having wrapped logic cores.

4. The method of claim 1, wherein the circuit design is a three-dimensional circuit design comprising a plurality of chips, each chip having a plurality of wrapped logic cores.

5. The method of claim 1, wherein the boundary logic includes functional flip-flops of the plurality of logic cores at a boundary of the plurality of logic cores.

6. The method of claim 1, wherein the wrapper cells comply with the IEEE 1500 architecture standard.

7. The method of claim 6, wherein one or more of the structural traces of the plurality of structural traces are performed in one or more EXTEST modes of the IEEE 1500 architecture standard.

8. A computer-readable non-transitory storage medium having stored thereon a plurality of instructions, said plurality of instructions when executed by a computer, cause said computer to perform:
   providing, in a memory of a computer system that hosts a test synthesis or ATPG environment, a circuit design having a plurality of logic cores, a plurality of wrapper cells, and controller logic, wherein the plurality of wrapper cells comprise a plurality of boundary logic, including state elements, and are serially-controllable and arranged in a plurality of wrapper chains having a plurality of scan input and output ports, wherein each wrapper cell of the plurality of wrapper cells has one or more input ports and one or more output ports, wherein each logic core is wrapped with one or more wrapper chains of the plurality of wrapper chains, and wherein the controller logic is designed to transmit a plurality of test control signals to the plurality of wrapper cells and their wrapper chains;
   identifying, for each of one or more test modes defined for the logic core, the plurality of wrapper cells for each input and output port of the plurality of input and output ports for each wrapper chain;

performing, for each of the one or more test modes, a plurality of structural traces on the plurality of wrapper chains, including logic core input ports and logic core output ports, to identify boundary logic and controller logic associated with each logic core;

extracting, for each of the one or more test modes, the boundary logic and the controller logic; and building a model for the plurality of logic cores, stored in a memory of the computer system, based on the extracted boundary logic and the extracted controller logic.

9. The computer-readable non-transitory storage medium of claim 8, wherein the plurality of instructions when executed by a computer, cause said computer to further perform performing a structural trace of one or more of a clock, a scan enable, and a scan data paths of the plurality of wrapper chains.

10. The computer-readable non-transitory storage medium of claim 8, wherein the circuit design is a three-dimensional circuit design comprising a plurality of chips, each chip having a plurality of wrapped logic cores.

11. The computer-readable non-transitory storage medium of claim 8, wherein the circuit design is a three-dimensional circuit design comprising a plurality of chips, each chip having a plurality of wrapped logic cores.

12. The computer-readable non-transitory storage medium of claim 8, wherein the boundary logic includes functional flip-flops of the plurality of logic cores at a boundary of the plurality of logic cores.

13. The computer-readable non-transitory storage medium of claim 8, wherein the wrapper cells comply with the IEEE 1500 architecture standard.

14. The computer-readable non-transitory storage medium of claim 13, wherein one or more of the structural traces of the plurality of structural traces are performed in one or more EXTEST modes of the IEEE 1500 architecture standard.

* * * * *